(12) United States Patent
Seon et al.

(10) Patent No.: US 8,529,802 B2
(45) Date of Patent: *Sep. 10, 2013

(54) SOLUTION COMPOSITION AND METHOD OF FORMING THIN FILM AND METHOD OF MANUFACTURING THIN FILM TRANSISTOR USING THE SOLUTION COMPOSITION

(75) Inventors: Jong-Baek Seon, Yongin-si (KR); Sang-Yoon Lee, Seoul (KR); Jeong-il Park, Seongnam-si (KR); Myung-Kwan Ryu, Yongin-si (KR); Kyung-Bae Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 368 days.

This patent is subject to a terminal disclaimer.

(21) Appl. No.: 12/656,682

(22) Filed: Feb. 12, 2010

(65) Prior Publication Data

US 2010/0210069 A1   Aug. 19, 2010

(30) Foreign Application Priority Data

Feb. 13, 2009 (KR) ......................... 10-2009-0011894
Jan. 28, 2010 (KR) ......................... 10-2010-0007951

(51) Int. Cl.
*H01B 1/02* (2006.01)
*H01B 1/06* (2006.01)
*H01B 1/12* (2006.01)
*H01L 21/44* (2006.01)

(52) U.S. Cl.
USPC ............... 252/519.51; 252/519.2; 252/519.3; 252/519.5; 252/519.54; 252/520.4; 252/520.5; 252/521.3; 438/652; 438/656; 257/E21.461

(58) Field of Classification Search
USPC ........... 252/500, 519.2, 519.3, 519.5, 519.51, 252/519.54, 520.4, 520.5, 521.3; 438/652, 438/656; 257/E21.461
See application file for complete search history.

(56) References Cited

U.S. PATENT DOCUMENTS

| | | | |
|---|---|---|---|
| 5,885,368 A | 3/1999 | Lupo et al. | |
| 5,972,527 A * | 10/1999 | Kaijou et al. | 428/697 |
| 2004/0113146 A1 * | 6/2004 | Dahmani et al. | 257/40 |
| 2004/0150331 A1 * | 8/2004 | Okubo et al. | 313/506 |
| 2006/0150891 A1 | 7/2006 | Ichinose et al. | |
| 2007/0109218 A1 | 5/2007 | Saito et al. | |
| 2007/0184576 A1 | 8/2007 | Chang et al. | |
| 2007/0194379 A1 | 8/2007 | Hosono et al. | |
| 2009/0278122 A1 | 11/2009 | Hosono et al. | |
| 2009/0280600 A1 | 11/2009 | Hosono et al. | |

FOREIGN PATENT DOCUMENTS

| | | | |
|---|---|---|---|
| JP | 60220505 | * | 11/1985 |
| JP | 61190075 | * | 8/1986 |
| JP | 06-187832 | | 7/1994 |
| JP | 0916542 A | * | 6/1997 |
| JP | 2000-048966 A | | 2/2000 |
| JP | 2007-042690 | | 2/2007 |
| JP | 2008288196 | * | 11/2008 |
| JP | 2009048986 A | * | 3/2009 |
| JP | 2009135098 A | * | 6/2009 |
| KR | 2007-0006854 A | | 1/2007 |
| KR | 2007-0116889 A | | 12/2007 |
| WO | WO 2005-088726 A1 | | 9/2005 |

OTHER PUBLICATIONS

Gun Hee Kim et al., "Formation Mechanism of Solution-Processed Nanocrystalline InGaZnO Thin Film as Active Channel Layer in Thin-Film Transistor", *J. Electromechanical Soc.*, vol. 156 (1) pp. H7-H9 (2009)
Office Action mailed May 10, 2013 in corresponding U.S. Appl. No. 13/650,819.

* cited by examiner

*Primary Examiner* — Harold Pyon
*Assistant Examiner* — Tanisha Diggs
(74) *Attorney, Agent, or Firm* — Harness, Dickey & Pierce, P.L.C.

(57) ABSTRACT

Disclosed is a solution composition for forming a thin film transistor including a zinc-containing compound, an indium-containing compound, and a compound including at least one metal or metalloid selected from the group consisting of hafnium (Hf), magnesium (Mg), tantalum (Ta), cerium (Ce), lanthanum (La), silicon (Si), germanium (Ge), vanadium (V), niobium (Nb), and yttrium (Y). A method of forming a thin film by using the solution composition, and a method of manufacturing thin film transistor including the thin film are also disclosed.

17 Claims, 7 Drawing Sheets

SOLUTION COMPOSITION AND METHOD OF FORMING THIN FILM AND METHOD OF MANUFACTURING THIN FILM TRANSISTOR USING THE SOLUTION COMPOSITION

CROSS-REFERENCE TO RELATED APPLICATION

This application claims priority to and the benefit of Korean Patent Applications No. 10-2009-0011894 filed on Feb. 13, 2009 and No. 10-2010-0007951 filed on Jan. 28, 2010 in the Korean Intellectual Property Office, the entire contents of which are incorporated herein by reference.

BACKGROUND

1. Field

This disclosure relates to a solution composition, and a method of forming a thin film and a method of manufacturing a thin film transistor using the solution composition.

2. Description of the Related Art

A thin film transistor (TFT) is used in various fields, and it is particularly used for a switching and driving device in a flat panel display such as a liquid crystal display (LCD), an organic light emitting diode display (OLED display), and an electrophoretic display (EPD).

The thin film transistor generally includes a gate electrode connected to a gate line transferring a scan signal, a source electrode connected to a data line transferring a signal applied to a pixel electrode, a drain electrode facing the source electrode, and a semiconductor electrically connected to the source electrode and the drain electrode when a predetermined voltage is applied.

The semiconductor is one of primary components for determining the characteristics of a thin film transistor. Such a semiconductor is generally composed of silicon (Si). Silicon is classified into amorphous silicon and polycrystalline silicon depending upon the crystal shape. Amorphous silicon may be obtained by a simple manufacturing process, but has insufficient charge mobility to provide a high performance thin film transistor, while polycrystalline silicon has high charge mobility, but it requires a step of crystallizing silicon which increases the cost and complicates the process.

Instead of the amorphous silicon and the polycrystalline silicon, an oxide semiconductor may be used. The oxide semiconductor may increase the charge mobility depending upon the deposition conditions when it is formed by vacuum deposition, and it does not require the additional process for crystallizing the semiconductor. However, since the vacuum deposition is a complicated process, it incurs a high cost, and it is limited in application to a large display device.

SUMMARY

One aspect of this disclosure provides a solution composition for forming an oxide semiconductor that is capable of improving thin film transistor characteristics as well as simplifying the forming process and decreasing the cost.

Another aspect of this disclosure provides a method of forming an oxide semiconductor thin film by using the solution composition.

Another aspect of this disclosure provides a method of manufacturing a thin film transistor by using the solution composition.

According to one aspect of this disclosure, a solution composition for an oxide thin film is provided that includes a zinc-containing first compound, an indium-containing second compound, and a third compound including at least one metal or metalloid selected from the group consisting of hafnium (Hf), magnesium (Mg), tantalum (Ta), cerium (Ce), lanthanum (La), silicon (Si), germanium (Ge), vanadium (V), niobium (Nb), or yttrium (Y).

According to another aspect of this disclosure, a method of forming an oxide thin film is provided that includes preparing a solution composition including a zinc-containing first compound, an indium-containing second compound, a third compound including at least one metal or metalloid selected from hafnium (Hf), magnesium (Mg), tantalum (Ta), cerium (Ce), lanthanum (La), silicon (Si), germanium (Ge), vanadium (V), niobium (Nb), or yttrium (Y), applying the solution composition on a substrate, and heat-treating the solution composition applied to the substrate to provide an oxide thin film.

According to another aspect of this disclosure, a method of manufacturing a thin film transistor is provided that includes providing a first electrode, applying a solution composition including a zinc-containing first compound, an indium-containing second compound, and a third compound including at least one metal or metalloid selected from hafnium (Hf), magnesium (Mg), tantalum (Ta), cerium (Ce), lanthanum (La), silicon (Si), germanium (Ge), vanadium (V), niobium (Nb), or yttrium (Y), at a position overlapping the first electrode, heat-treating the solution composition to provide an oxide semiconductor thin film, providing a second electrode that is electrically connected with the oxide semiconductor thin film, and annealing the oxide semiconductor thin film after providing the first electrode, the oxide semiconductor thin film, and the second electrode.

The metal or metalloid may be included in an amount of about 50 at % or less based on the total numbers of zinc and indium atoms of the solution composition.

The zinc and the indium may be used at an atomic ratio ranging from about 1:10 to about 10:1.

The zinc and the indium may be used at an atomic ratio ranging from about 1:5 to about 5:1.

The zinc and the indium may be used at an atomic ratio ranging from about 1:10 to about 1:1.

The zinc and the indium may be used at an atomic ratio ranging from about 1:5 to about 1:1.

The first compound may include at least one selected from the group consisting of zinc hydroxide, zinc alkoxide, zinc citrate, zinc acetate, zinc carbonate, zinc (meth)acrylate, zinc nitrate, zinc acetylacetonate, zinc halide, zinc thiocarbamate, zinc sulfonate, zinc undecylate, zinc borate, and hydrates thereof.

The second compound may include at least one selected from the group consisting of indium hydroxide, indium alkoxide, indium citrate, indium acetate, indium carbonate, indium (meth)acrylate, indium nitrate, indium acetylacetonate, indium halide, indium thiocarbamate, indium sulfonate, indium undecylate, indium borate, and hydrates thereof.

The first compound may be zinc acetate hydrate, and the second compound may be indium acetyl acetonate.

The solution composition for an oxide thin film may further include an alcohol amine compound, an alkyl ammonium hydroxy compound, an alkyl amine compound, a ketone compound, an acid compound, a base compound, and deionized water.

In the method of manufacturing the thin film transistor, annealing of the oxide semiconductor thin film is performed at about 200 to about 400° C.

The annealed oxide semiconductor thin film may have resistivity of about $10^{-3}$ Ωcm to about $10^{10}$ Ωcm.

DETAILED DESCRIPTION

Figure 1:
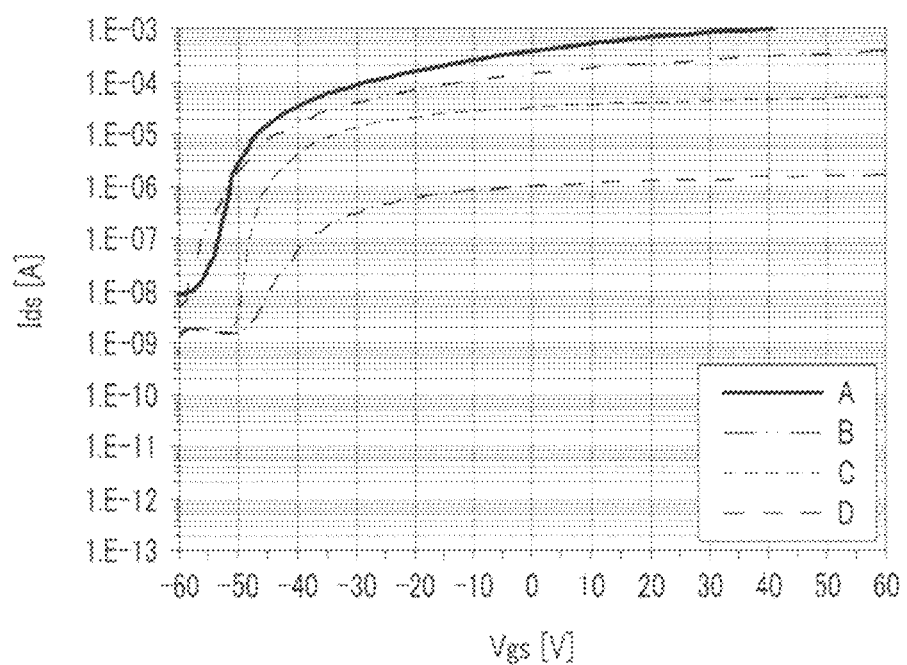
FIG. 1 is a graph showing the current characteristics of thin film transistors according to Examples I-1 and I-2 and Comparative Examples 1 and 2.

Exemplary embodiments will be described more fully hereinafter with reference to the accompanying drawings. This disclosure may, however, be embodied in many different forms and is not to be construed as limited to the exemplary embodiments set forth herein.

Hereinafter, a solution composition according to one embodiment is described.

As used herein, the terms "a" and "an" are open terms that may be used in conjunction with singular items or with plural items.

The solution composition according to one embodiment is a precursor solution used for forming an oxide semiconductor thin film.

The precursor solution includes a compound containing zinc (Zn) (hereinafter referred to as "zinc-containing compound") and a compound containing indium (In) (hereinafter referred to as "indium-containing compound").

The zinc-containing compound may include a zinc salt of its hydrates, but is not limited thereto. Examples of the zinc salt may include zinc hydroxide; zinc alkoxide; zinc citrate; zinc acetate such as zinc trifluoroacetate; zinc carbonate; zinc (meth)acrylate; zinc nitrate; zinc halide such as zinc chloride, zinc fluoride and zinc perchlorate; zinc phosphate; zinc thiocarbamate such as zinc dimethyldithiocarbamate and zinc diethyldithiocarbamate; zinc acetylacetonate such as zinc hexafluoroacetylacetonate; zinc sulfonate such as zinc trifluoromethanesulfonate; zinc undecylenate; and zinc borate such as zinc tetrafluoroborate.

The indium-containing compound may include an indium salt of its hydrates, but is not limited thereto. Examples of the indium salt may include indium hydroxide; indium alkoxide; indium citrate; indium acetate such as indium trifluoroacetate; indium carbonate; indium (meth)acrylate; indium nitrate; indium halide such as indium chloride, indium fluoride and indium perchlorate; indium phosphate; indium thiocarbamate such as indium dimethyldithiocarbamate and indium diethyldithiocarbamate; indium acetylacetonate such as indium hexafluoroacetylacetonate; indium sulfonate such as indium trifluoromethanesulfonate; indium undecylenate; and indium borate such as indium tetrafluoroborate.

It is possible to combine the zinc-containing compound with the indium-containing compound in various ways, but in one embodiment, when the zinc-containing compound is zinc acetate hydrate and the indium-containing compound is indium acetyl acetonate, it is possible to provide a solution composition with high solubility. Thereby, it is possible to ensure a uniform thin film.

In the precursor solution, zinc and indium are included in an atomic ratio of about 1:10 to about 10:1, in one embodiment, about 1:5 to about 5:1, in another embodiment, about 1:10 to about 1:1, and in yet another embodiment, about 1:5 to about 1:1. When zinc and indium are included in the range, the oxide thin film obtained from the precursor solution may exhibit the semiconducting characteristic.

The precursor solution further includes another compound including a metal other than zinc and indium or metalloid (X) (hereinafter referred to as "metal-containing compound") in addition to the zinc-containing compound and the indium-containing compound. The possibly included metal or metalloid (hereinafter referred to as "metal") (X) may be at least one selected from the group consisting of hafnium (Hf), magnesium (Mg), tantalum (Ta), cerium (Ce), lanthanum (La), silicon (Si), germanium (Ge), vanadium (V), niobium (Nb), and yttrium (Y), and the compound may be introduced, for example, in a form of a halide; an acetate compound; a carbonyl compound; a carbonate compound; a nitate compound; an alkoxide compound; or hydrates thereof.

The metal (X) may act as a factor for controlling the threshold voltage when the oxide semiconductor obtained from the precursor solution is applied to a thin film transistor. The metal (X) may be included in an amount of about 50 at % or less based on the total numbers of zinc and indium atoms in the precursor solution, in one embodiment about 0.0001 at % to about 30 at %, in another embodiment, about 0.0001 at % to about 25 at %, and in yet another embodiment, about 0.01 at % to about 20 at %. When the metal (X) is included in the range, it is possible to control the threshold voltage in the oxide semiconductor obtained from the precursor solution, and simultaneously, it is possible for a thin film transistor to have a sufficient on-current since the amount of indium and zinc in the oxide semiconductor is not significantly decreased.

Each of the zinc-containing compound, the indium-containing compound, and the metal-containing compound is a precursor of an oxide semiconductor thin film, and an oxide semiconductor thin film including indium, zinc, and other metals is formed through heat treatment as follows.

The zinc-containing compound, the indium-containing compound, and the metal-containing compound may respectively be included at about 0.01 to 30 wt % based on the total amount of precursor solution. When each component is included in the range, it is possible to obtain solubility.

The precursor solution may further include a solution stabilizer. The solution stabilizer may include at least one selected from the group consisting of an alcohol amine compound such as monoethanol amine, diethanol amine, triethanol amine, N,N-methylethanol amine, aminoethyl ethanol amine, N-t-butylethanol amine, N-t-butyldiethanol amine, and diethylene glycol amine; an alkyl ammonium hydroxy compound such as tetramethylammonium hydroxide; an alkyl amine compound such as methylamine, ethylamine, and monoisopropyl amine; a ketone compound such as acetylacetone; an acid compound such as hydrochloric acid, nitric acid, sulfuric acid, and acetic acid; a base compound such as ammonium hydroxide, potassium hydroxide, and sodium hydroxide; alkoxy alcohol such as 2-(aminoethoxy)ethanol; and deionized water.

The solution stabilizer may be included in a precursor solution to increase the solubility of other components, so it is possible to provide a uniform thin film. The amount of solution stabilizer may be varied depending upon the kind and amount of other components, but it may be included at about 0.01 to about 30 wt % based on the total amount of the precursor solution. When the solution stabilizer is included in the range, it may improve the solubility and thin film coating properties.

The zinc-containing compound, the indium-containing compound, the metal-containing compound, and the solution stabilizer are mixed in a solvent to provide a precursor solution. The zinc-containing compound and the indium-containing compound may be respectively prepared by providing a solution that is mixed in each solvent, mixing the same, and then mixing them with a metal-containing compound or a solution including a metal-containing compound. A solution stabilizer may be added to each solution of components or may be added after mixing each solution. For example, zinc acetate hydrate and indium acetyl acetonate are respectively mixed with a solvent to provide a zinc acetate hydrate solution and an indium acetyl acetonate solution, and then hafnium chloride or a solution including hafnium chloride is added to provide a precursor solution.

Alternatively, a precursor solution may be prepared by mixing a zinc-containing compound, an indium-containing compound, a metal-containing compound, and a solution stabilizer in a solvent.

The solvent may be any solvent that dissolves the above components, and is not particularly limited. Non-limiting examples of the solvent may include at least one selected from deionized water, methanol, ethanol, propanol, isopropanol, 2-methoxyethanol, 2-ethoxyethanol, 2-propoxyethanol 2-butoxyethanol, methylcellosolve, ethylcellosolve, diethyleneglycol methylether, diethyleneglycol ethylether, dipropyleneglycol methylether, toluene, xylene, hexane, heptane, octane, ethylacetate, butylacetate, diethyleneglycol dimethylether, diethyleneglycol dimethylethylether, methylmethoxy propionic acid, ethylethoxy propionic acid, ethyl lactic acid, propylene glycol methylether acetate, propylene glycol methylether, propylene glycol propylether, methyl cellosolve acetate, ethyl cellosolve acetate, diethylene glycol methylacetate, diethylene glycol ethylacetate, acetone, methyl isobutyl ketone, cyclohexanone, dimethyl formamide (DMF), N,N-dimethyl acetamide (DMAc), N-methyl-2-pyrrolidone, γ-butyrolactone, diethylether, ethylene glycol dimethylether, diglyme, tetrahydrofuran, acetylacetone, and acetonitrile.

The solvent may be included as an balance amount based on the total amount of the solution composition excepting the amount of the components.

The precursor solution may be stirred before the applying to a substrate. The stirring step may be carried out by stirring the precursor solution at a temperature ranging from about room temperature to about 100° C. for about 1 to about 100 hours, and it may be performed using an agitator or ultrasonic waves. The solubility and thin film coating properties may be improved by the stirring step.

The precursor solution may be applied to a substrate by a method such as spin coating, slit coating, spin and slit coating, inkjet printing, spraying, and dipping.

Subsequently, the precursor solution applied to the substrate is heated to form an oxide semiconductor thin film. The heat treatment may be carried out by prebaking at a relatively low temperature to remove the solvent to some degree, and then heating at a relatively high temperature. The heat treatment may be performed at a temperature of about 200 to about 500° C.

The oxide semiconductor has a resistivity of about $10^{-3}$ Ωcm to about $10^{10}$ Ωcm.

Hereinafter, one embodiment in which the oxide semiconductor is applied to a thin film transistor is described with reference to the drawings.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 6:
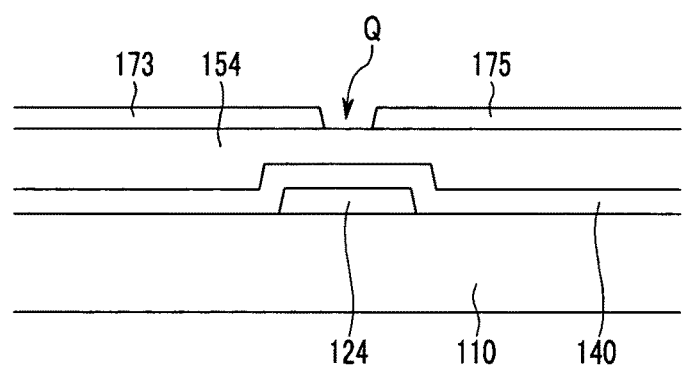
FIG. 6 is a cross-sectional view of a thin film transistor according to one embodiment.

FIG. 6 is a cross-sectional view showing a thin film transistor according to one embodiment.

Referring to FIG. 6, the thin film transistor includes a gate electrode 124 formed on a substrate 110, and a gate insulating layer 140 formed to cover the whole surface of the substrate and the gate electrode 124.

An oxide semiconductor 154 is formed to overlap the gate electrode 124 on the gate insulating layer 140. The oxide semiconductor 154 may be made using the solution composition. The oxide semiconductor 154 may be made of an oxide including indium (In) and zinc (Zn), and at least one metal or metalloid selected from the group consisting of hafnium (Hf), magnesium (Mg), tantalum (Ta), cerium (Ce), lanthanum (La), silicon (Si), germanium (Ge), vanadium (V), niobium (Nb), and yttrium (Y). The oxide semiconductor 154 has semiconductor properties due to resistivity ranging from about $10^{-3}$ Ωcm to about $10^{10}$ Ωcm.

A source electrode 173 and a drain electrode 175 are formed to face each other on the oxide semiconductor 154, and they are electrically connected with the oxide semiconductor 154 when a predetermined voltage is applied. A channel Q of the thin film transistor is formed in the oxide semiconductor 154 between the source electrode 173 and the drain electrode 175.

Figure 7:
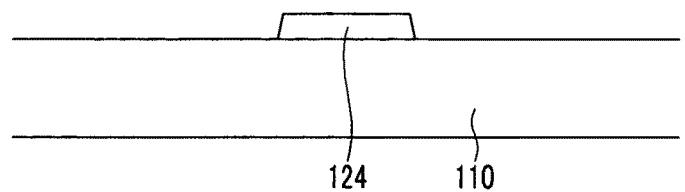
FIGS. 7 to 9 are cross-sectional views sequentially showing a method of manufacturing a thin film transistor shown in FIG. 3.
Figure 8:
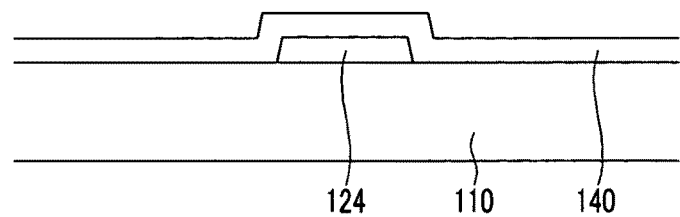
Figure 9:
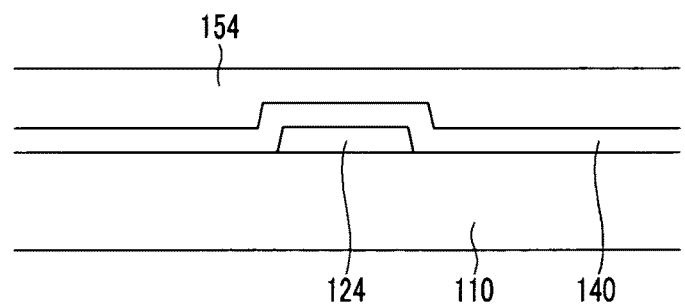

FIGS. 7 to 9 are cross-sectional views sequentially showing a method of manufacturing a thin film transistor shown in FIG. 6.

As shown in FIG. 7, a conductive layer (not shown) is deposited on the substrate 110 and subjected to photolithography to provide the gate electrode 124.

As shown in FIG. 8, an insulating layer such as silicon oxide ($SiO_2$), silicon nitride ($SiN_x$), and an organic insulating material is deposited on the gate electrode 124 to provide the gate insulating layer 140.

As shown in FIG. 9, the oxide semiconductor 154 is formed on the gate insulating layer 140. The oxide semiconductor 154 is obtained by preparing a precursor solution including an indium-containing compound, a zinc-containing compound, and a compound containing at least one metal or metalloid selected from the group consisting of hafnium (Hf), magnesium (Mg), tantalum (Ta), cerium (Ce), lanthanum (La), silicon (Si), germanium (Ge), vanadium (V), niobium (Nb), and yttrium (Y), applying the precursor solution to the substrate, and heating the precursor solution applied to the substrate. Through the heat treatment, the solvent is removed to form an oxide semiconductor thin film. The oxide semiconductor 154 has semiconductor properties due to resistivity ranging from about $10^{-3}$ Ωcm to about $10^{10}$ Ωcm.

Then, the oxide semiconductor thin film may be patterned by wet etching using etching solutions, or dry etching using plasma.

As shown in FIG. 6, a conductive layer (not shown) is deposited on the oxide semiconductor 154 and subjected to photolithography to provide the source electrode 173 and the drain electrode 175.

Subsequently the resulting thin film transistor is additionally subjected to annealing. The annealing is preformed at about 200 to about 400° C. The additional annealing improves properties of an oxide semiconductor.

The following examples illustrate one embodiment in more detail. However, it is understood that the scope of this disclosure is not limited to these examples.

EXAMPLE I

EXAMPLE I-1

Preparation of Solution Composition

Zinc acetate hydrate is dissolved in 2-methoxyethanol to provide about 0.2M of a zinc acetate hydrate solution, and then ethanol amine is added thereto at the same equivalent of the zinc acetate hydrate. In the same way, indium acetyl acetonate is dissolved in 2-methoxyethanol to provide about 0.2M of an indium acetyl acetonate solution, and then ethanolamine is added at 3 equivalents with respect to indium acetyl acetonate. Then the zinc acetate hydrate solution and the indium acetyl acetonate solution are mixed to provide a solution composition. In the solution composition, the atomic ratio of indium and zinc is adjusted to about 1:1 by regulating the amount of zinc acetate hydrate and indium acetyl acetonate.

Hafnium chloride ($HfCl_4$) is added to the solution composition. The hafnium chloride is added so that an atomic ratio of hafnium to indium is about 0.15:1 in the solution composition.

The solution composition is agitated at room temperature.

Fabrication of Thin Film Transistor

On the glass substrate, 2000 Å thick molybdenum is sputtered and patterned to form a gate electrode. Then, silicon nitride is deposited using a chemical vapor deposition (CVD) method 350° C. to provide a 4000 Å-thick gate insulating layer. The solution composition is applied to the gate insulating layer. Spin coating is performed at about 1000 rpm for abut 30 seconds. The substrate is prebaked at about 100° C. for about 1 minute to remove a solvent, and then heat-treated at about 450° C. for about 1 hour to provide an oxide semiconductor thin film (HfIZO). The oxide semiconductor thin film is patterned using an etching solution. 1000 Å-thick aluminum is deposited using a shadow mask to provide a source electrode and a drain electrode.

EXAMPLE I-2

A thin film transistor is manufactured according to the same method as in Example I-1, except that the atomic ratio of indium (In):zinc (Zn):hafnium (Hf) in a solution composition is adjusted to about 1:3:0.2.

COMPARATIVE EXAMPLE 1

A thin film transistor is manufactured according to the same method as in Example I-1, except that a solution composition excluding hafnium chloride ($HfCl_4$) is used.

COMPARATIVE EXAMPLE 2

A thin film transistor is manufactured according to the same method as in Example I-1, except that the atomic ratio of indium (In):zinc (Zn) in a solution composition is adjusted to about 1:3 and hafnium chloride ($HfCl_4$) is not used.

EXAMPLE II

EXAMPLE II-1

Preparation of Solution Composition

Zinc acetate hydrate is dissolved in 2-methoxyethanol to provide about 0.2M of a zinc acetate hydrate solution, and then ethanol amine is added thereto at the same equivalent of the zinc acetate hydrate. In the same way, indium acetyl acetonate is dissolved in 2-methoxyethanol to provide about 0.2M of an indium acetyl acetonate solution, and then ethanolamine is added at 3 equivalents with respect to indium acetyl acetonate. Then the zinc acetate hydrate solution and the indium acetyl acetonate solution are mixed to provide a solution composition. In the solution composition, the atomic ratio of indium and zinc is adjusted to about 3:1 by regulating the amount of zinc acetate hydrate and indium acetyl acetonate.

Hafnium acetylacetonate is dissolved in 2-methoxyethanol to prepare 0.2M hafnium precursor solution.

The hafnium precursor solution and the indium-zinc precursor solution are mixed to prepare a solution composition. The hafnium precursor solution is mixed so that a number of hafnium atoms is adjusted to about 0.1 based on that of zinc atoms (0.025 based on total numbers of zinc and indium atoms) in the solution composition.

Fabrication of Thin Film Transistor

On the glass substrate, 2000 Å thick molybdenum is sputtered and patterned to form a gate electrode. Then, silicon nitride is deposited using a chemical vapor deposition (CVD) method 350° C. to provide a 4000 Å-thick gate insulating layer. The solution composition is applied to the gate insulating layer. Spin coating is performed at about 1000 rpm for abut 30 seconds. The substrate is prebaked at about 100° C. for about 1 minute to remove a solvent, and then heat-treated at about 450° C. for about 1 hour to provide an oxide semiconductor thin film (HfIZO).

The oxide semiconductor thin film is patterned using an etching solution. 1000 Å-thick aluminum is deposited using a shadow mask to provide a source electrode and a drain electrode.

The thin film transistor is annealed at about 200 to about 400° C.

EXAMPLE II-2

A thin film transistor is manufactured according to the same method as in Example II-1, except that a number of hafnium atoms is about 0.3 based on that of zinc atoms (0.075 based on total numbers of zinc and indium atoms) in the solution composition.

EXAMPLE II-3

A thin film transistor is manufactured according to the same method as in Example II-1, except that a number of hafnium atoms is about 0.5 based on that of zinc atoms (0.125 based on total numbers of zinc and indium atoms) in the solution composition.

COMPARATIVE EXAMPLE 3

A thin film transistor is manufactured according to the same method as in Example II-1, except that the hafnium precursor solution is not mixed and an indium-zinc precursor solution is used to prepare a solution composition.

EXAMPLE III

EXAMPLE III-1

A thin film transistor is manufactured according to the same method as in Example II-1, except that lanthanum nitrate hydrate $(La(NO_3)_3 \cdot xH_2O)$ is dissolved 2-methoxyethanol to prepare 0.2M lanthanum precursor solution instead of the hafnium precursor solution. In the lanthanum precursor solution, a number of lanthanum atoms is adjusted to about 0.1 based on that of zinc atoms (0.025 based on total numbers of zinc and indium atoms) in the solution composition.

EXAMPLE III-2

A thin film transistor is manufactured according to the same method as in Example III-1, except that a number of lanthanum atoms is about 0.3 based on that of zinc atoms (0.075 based on total numbers of zinc and indium atoms) in the solution composition.

EXAMPLE III-3

A thin film transistor is manufactured according to the same method as in Example III-1, except that a number of lanthanum atoms is about 1.0 based on that of zinc atoms (0.25 based on total numbers of zinc and indium atoms) in the solution composition.

COMPARATIVE EXAMPLE 4

A thin film transistor is manufactured according to the same method as in Example III-1, except that the lanthanum precursor solution is not mixed and an indium-zinc precursor solution is used to prepare a solution composition.

EXAMPLE IV

EXAMPLE IV-1

A thin film transistor is manufactured according to the same method as in Example II-1, except that silicon acetate is dissolved 2-methoxyethanol to prepare 0.2M silicon precursor solution instead of the hafnium precursor solution. The silicon precursor solution is mixed so that a number of silicon atoms is adjusted to about 0.3 based on that of zinc atoms (0.075 based on total numbers of zinc and indium atoms) in the solution composition.

EXAMPLE IV-2

A thin film transistor is manufactured according to the same method as in Example IV-1, except that a number of silicon atoms is about 0.5 based on that of zinc atoms (0.125 based on total numbers of zinc and indium atoms) in the solution composition.

COMPARATIVE EXAMPLE 5

A thin film transistor is manufactured according to the same method as in Example IV-1, except that the silicon precursor solution is not mixed and an indium-zinc precursor solution is used to prepare a solution composition.

EXAMPLE V

EXAMPLE V-1

A thin film transistor is manufactured according to the same method as in Example II-1, except that magnesium nitrate hydrate $(Mg(NO_3)_2 \cdot xH_2O)$ is dissolved 2-methoxyethanol to prepare 0.2M magnesium precursor solution instead of the hafnium precursor solution. In the magnesium precursor solution, a number of magnesium is adjusted to about 0.3 based on that of zinc atoms (0.075 based on total numbers of zinc and indium atoms) in the solution composition.

EXAMPLE V-2

A thin film transistor is manufactured according to the same method as in Example V-1, except that a number of magnesium atoms is about 0.5 based on that of zinc atoms (0.125 based on total numbers of zinc and indium atoms) in the solution composition.

COMPARATIVE EXAMPLE 6

A thin film transistor is manufactured according to the same method as in Example V-1, except that the magnesium precursor solution is not mixed and an indium-zinc precursor solution is used to prepare a solution composition.

Evaluation 1: Atomic Ratio

Table 1 shows the atomic ratio of indium (In), zinc (Zn), and hafnium (Hf) included in the solution compositions according to Examples I-1 and I-2.

TABLE 1

| No. | I-1 | I-2 |
|---|---|---|
| In:Zn:Hf | 1:1:0.15 | 1:3:0.2 |

Table 2 shows the atomic ratio of indium (In), zinc (Zn) and hafnium (Hf) in the oxide thin film disposed on a substrate according to Example I-2. The atomic ratio of each component present in the thin film is measured by Rutherford backscattering spectrometry (RBS).

TABLE 2

| Analyzed sample | | In | Zn | X | O |
|---|---|---|---|---|---|
| HfIZO | Solution | 1 | 3 | 0.2 | — |
| (No. I-2) | Thin film | 1 | 2.7 | 0.17 | 4.3 |

Referring to Table 2, the atomic ration of indium (In), zinc (Zn), and hafnium (Hf) in the oxide semiconductor thin films are roughly maintained from the atomic ratios of indium, zinc, and metal in the solution compositions. Particularly, the atomic ratio of zinc to indium in the oxide semiconductor thin film according to Example 2 is about 3:2.7 while maintaining the atomic ratio at about 90%, and the atomic ratio of hafnium (Hf) to indium is about 0.2:0.17 while maintaining the atomic ratio at about 85%.

The atomic ratio of the components in the solution composition is maintained at least 80% after forming the oxide semiconductor thin film, which indicates that the atomic ratio of the components in the oxide semiconductor thin film may be controlled by changing the composition of each component. Accordingly, an oxide semiconductor having a desirable atomic ratio may be formed by adjusting the mixing ratio of components in the solution composition.

Evaluation 2: Current Characteristics of Thin Film Transistor

Current characteristics of the thin film transistors according to Examples are measured.

EXAMPLE I

Referring to FIG. 1, current characteristics of thin film transistors according to Examples I-1 and I-2 are described.

Figure 2:
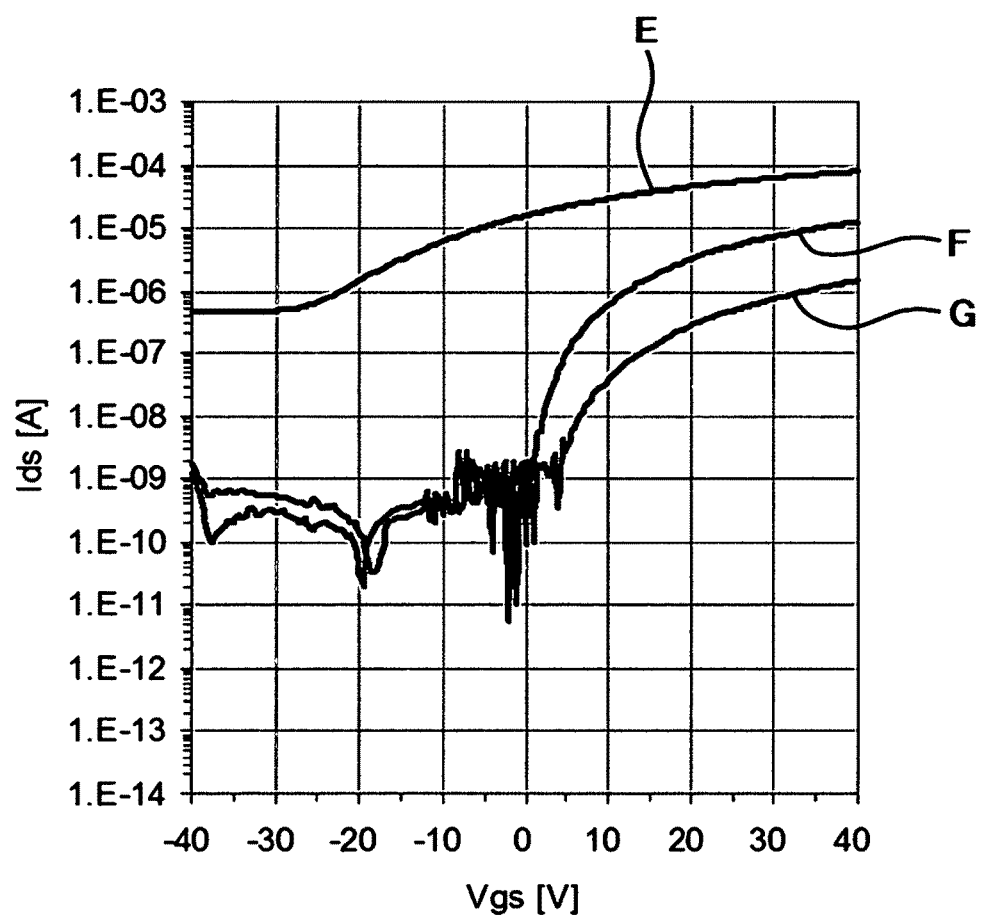
FIG. 2 is a graph showing the current characteristics of thin film transistors according to Examples II-1 to II-3, and Comparative Example 3.

FIG. 2 is a graph showing current characteristics of the thin film transistors according to Examples I-1 and I-2, and Comparative Examples 1 and 2.

In FIG. 1, "A", "B", "C," and "D" show current characteristics of the thin film transistors including an oxide semiconductor obtained from each solution composition of Comparative Examples 1 and 2 and Examples I-1 and I-2, respectively.

As shown in FIG. 1, thin film transistors using the solution compositions according to Examples I-1 and I-2 and Comparative Examples 1 and 2 hav a sufficiently high on-current (Ids).

In addition, it is confirmed that the thin film transistor including the oxide semiconductor ("C" and "D") obtained from the solution composition including hafnium (Hf) decreases the on-current to some degree, but the turn-on voltage is shifted in a positive way, which indicates that hafnium acted as a factor in controlling the threshold voltage of the thin film transistor. The thin film transistor including the oxide semiconductors (E) according to Comparative Examples 1 and 2 excluding hafnium are not appropriate as a semiconductor because turn-on voltages are difficult to control.

EXAMPLE II

Referring to Table 3 and FIG. 2, current characteristics of thin film transistors according to Examples II-1 to II-3 are described.

Table 3 shows mobility and turn-on voltages of thin film transistors according to Examples II-1 to II-3 and Comparative Example 3.

TABLE 3

|  | Example II-1 | Example II-2 | Example II-3 | Comparative Example 3 |
|---|---|---|---|---|
| Hf/Zn | 0.1 | 0.3 | 0.5 | 0 |
| Hf/(In + Zn) | 0.025 | 0.075 | 0.125 | 0 |
| Mobility (at 10 V) (cm2/Vs) | 0.4 | 0.1 | 0.003 | 1.2 |
| Turn-on voltage (V) | 2 | 5 | 10 | −27 |

FIG. 2 is a graph showing the current characteristics of thin film transistors according to Examples II-1 to II-3, and Comparative Example 3.

In FIG. 2, "E," "F," and "G" show current characteristics of the thin film transistors including an oxide semiconductor obtained from each solution composition of Comparative Example 3, and Example II-1 and II-2, respectively.

As shown in FIG. 2, thin film transistors including oxide semiconductors obtained from the solution compositions including hafnium (Hf) ("F" and "G") shows a turn-on voltage shifted in a positive way, which indicates that the hafnium (Hf) acted as a factor in controlling the threshold voltage of the thin film transistor. The thin film transistor including the oxide semiconductor ("E") according to Comparative Example 3 is not turn-on at a low voltage, and has off-current, which indicates that it is not appropriate as a semiconductor.

EXAMPLE III

Figure 3:
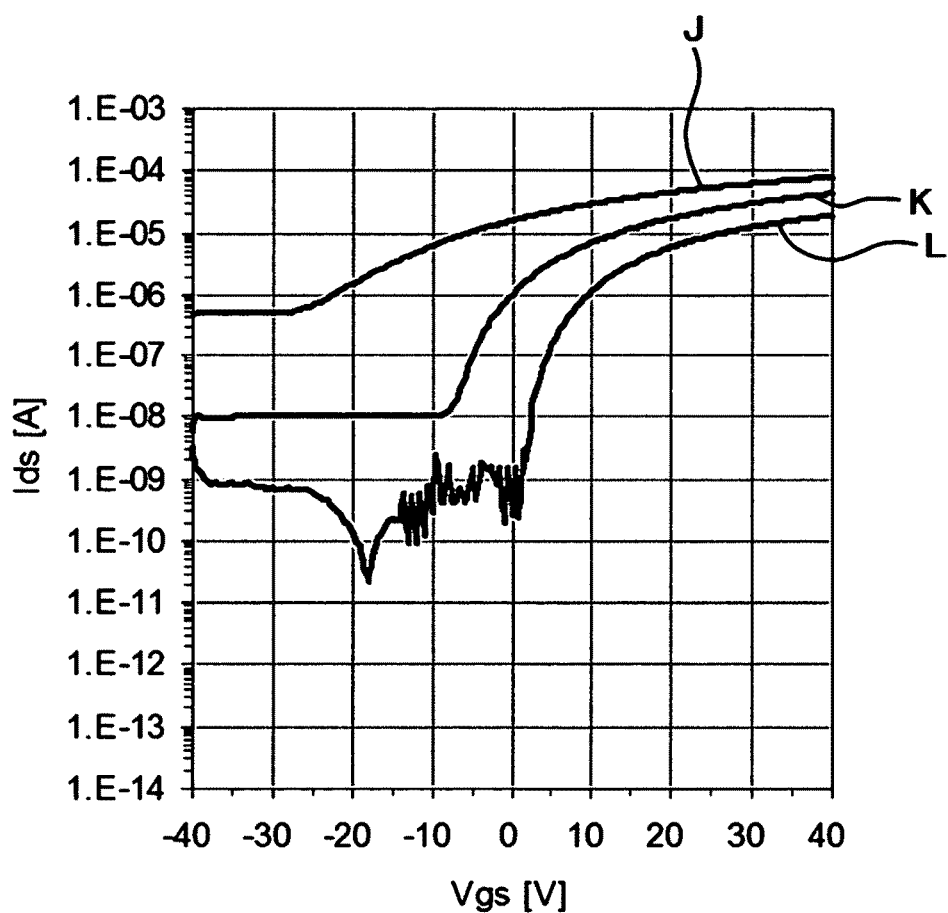
FIG. 3 is a graph showing the current characteristics of thin film transistors according to Examples III-1 to III-3, and Comparative Example 4.

Referring to Table 4 and FIG. 3, current characteristics of thin film transistors according to Examples III-1 to III-3 are described.

Table 4 shows mobility and a turn-on voltage of thin film transistors according to Examples III-1 to III-3, and Comparative Example 4.

TABLE 4

|  | Example III-1 | Example III-2 | Example III-3 | Comparative Example 4 |
|---|---|---|---|---|
| La/Zn | 0.1 | 0.3 | 1.0 | 0 |
| La/(In + Zn) | 0.025 | 0.075 | 0.25 | 0 |
| Mobility (at 10 V) (cm$^2$/Vs) | 1.0 | 0.5 | 0.003 | 1.2 |
| Turn-on voltage (V) | −7 | 3 | 11 | −27 |

FIG. 3 is a graph showing current characteristics of the thin film transistors according to Examples III-1 and III-2, and Comparative Examples 4 and 2.

In FIG. 3, "J," "K," and "L" show current characteristics of the thin film transistors including an oxide semiconductor obtained from each solution composition of Comparative Example 4, and Examples III-1 and III-2, respectively.

As shown in FIG. 3, thin film transistors including oxide semiconductors obtained from the solution compositions including lanthanum (La) ("K" and "L") shows a turn-on voltage shifted in a positive way, which indicates that the lanthanum (La) acted as a factor in controlling the threshold voltage of the thin film transistor. The oxide semiconductor ("E") according to Comparative Example 4 is not turn-on at a low voltage, and has off-current, which indicates that it is not appropriate as a semiconductor.

EXAMPLE IV

Figure 4:
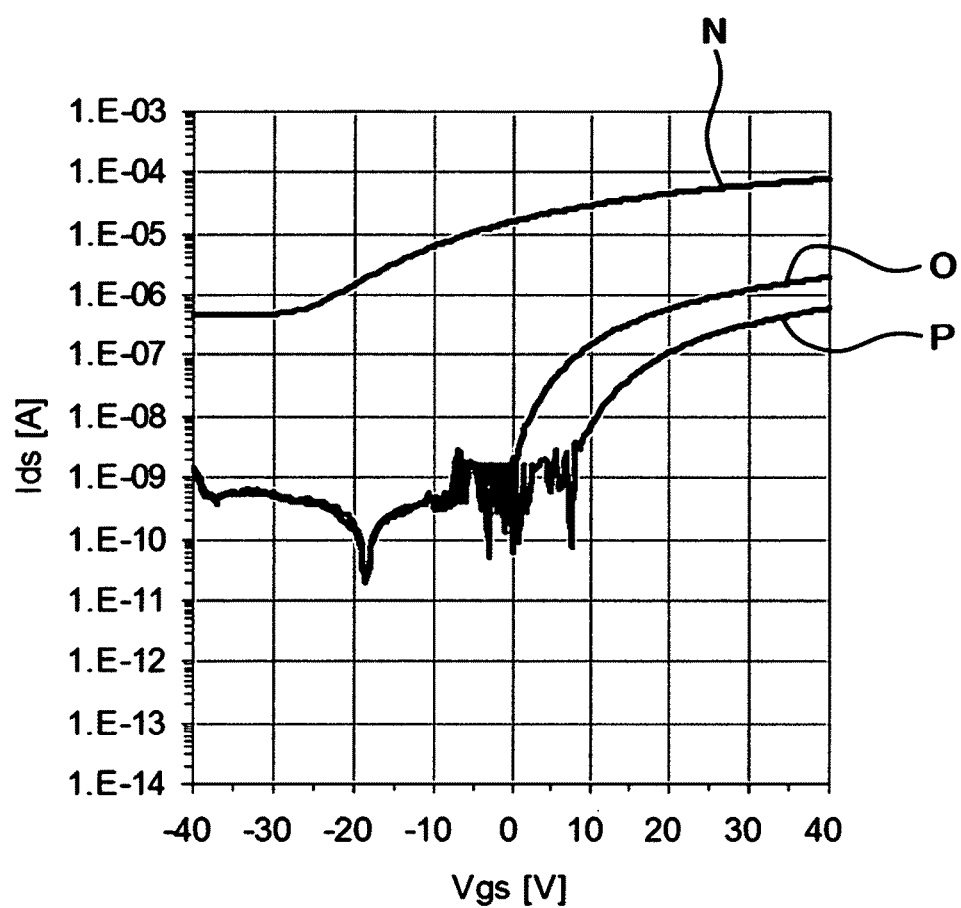
FIG. 4 is a graph showing the current characteristics of thin film transistors according to Examples IV-1 and IV-3, and Comparative Example 5.

Referring to Table 5 and FIG. 4, current characteristics of thin film transistors according to Examples III-1 to III-3 are described.

Table 5 shows mobility and a turn-on voltage of thin film transistors according to Examples IV-1 and IV-2, and Comparative Example 5.

TABLE 5

|  | Example IV-1 | Example IV-2 | Comparative Example 5 |
|---|---|---|---|
| Si/Zn | 0.3 | 0.5 | 0 |
| Si/(In + Zn) | 0.075 | 0.125 | 0 |
| Mobility (at 10 V) (cm$^2$/Vs) | 0.05 | 0.02 | 1.2 |
| Turn-on voltage (V) | 2 | 7 | −27 |

FIG. 4 is a graph showing current characteristics of the thin film transistors according to Examples IV-1 and IV-2, and Comparative Examples 5 and 2.

In FIG. 4, "N," "O" and "P" show current characteristics of the thin film transistors including an oxide semiconductor obtained from each solution composition of Comparative Example 5, and Examples IV-1 and IV-2, respectively.

As shown in FIG. 4, thin film transistors including oxide semiconductors obtained from the solution compositions including silicon (Si) ("O" and "P") shows a turn-on voltage shifted in a positive way, which indicates that the silicon (Si) acted as a factor in controlling the threshold voltage of the thin film transistor. The oxide semiconductor ("N") according to Comparative Example 5 is not turn-on at a low voltage, and has off-current, which indicates that it is not appropriate as a semiconductor.

EXAMPLE V

Figure 5:
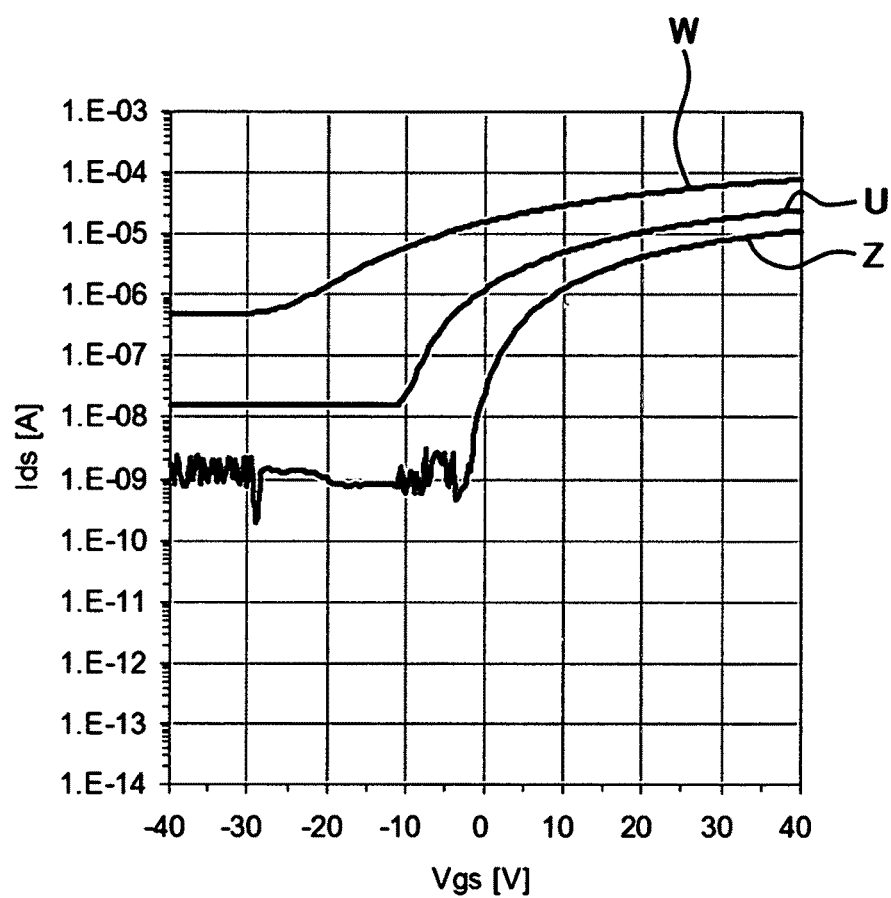
FIG. 5 is a graph showing the current characteristics of thin film transistors according to Examples V-1 and V-2, and Comparative Example 6.

Referring to Table 6 and FIG. 5, current characteristics of thin film transistors according to Examples V-1 and V-2 are described.

Table 6 shows mobility and turn-on voltages of thin film transistors according to Examples V-1 and V-2, and Comparative Example 6.

TABLE 6

|  | Example V-1 | Example V-2 | Comparative Example 6 |
|---|---|---|---|
| Mg/Zn | 0.3 | 0.5 | 0 |
| Mg/(In + Zn) | 0.075 | 0.125 | 0 |
| Mobility (at 10 V) (cm2/Vs) | 0.6 | 0.3 | 1.2 |
| Turn-on voltage (V) | −10 | −2 | −27 |

FIG. 5 is a graph showing the current characteristics of thin film transistors according to Examples V-1 and V-2 and Comparative Example 6.

In FIG. 5, "U," "W" and "Z" show current characteristics of the thin film transistors including an oxide semiconductor obtained from each solution composition of Comparative Example 6, and Example V-1 and V-2, respectively.

As shown in FIG. 5, thin film transistors including oxide semiconductors obtained from the solution compositions including magnesium (Mg) ("W" and "Z") shows a turn-on voltage shifted in a positive way, which indicates that the magnesium (Mg) acted as a factor in controlling the threshold voltage of the thin film transistor. The oxide semiconductor ("W") according to Comparative Example 6 is not turn-on at a low voltage, and has off-current, which indicates that it is not appropriate as a semiconductor.

As described above, the oxide semiconductor according to the examples may be formed in a form of solution, so it is possible to simplify the process and reduce costs. In addition, the atomic ratio of components such as indium and zinc in the solution composition may be almost maintained after forming the oxide semiconductor thin film, so it is possible to obtain desirable current characteristics by controlling the atomic ratio of components in the solution composition. Furthermore, it is possible to control the threshold voltage by including metals other than indium and zinc to shift the turn-on voltage of the thin film transistor in a positive way. Accordingly, it is possible to drive the thin film transistor at a relatively low voltage so as to decrease power consumption.

The above description is exemplarily given for an oxide semiconductor applied to a thin film transistor, but it is not limited thereto. It may similarly apply to any device requiring a semiconductor thin film. The above description is exemplarily given for a thin film transistor of a bottom gate structure, but it is not limited thereto. It may similarly apply to a thin film transistor of any structure such as a top gate structure.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A solution composition for an oxide thin film, comprising:
    a zinc-containing first compound;
    an indium-containing second compound; and
    a third compound comprising at least one metal or metalloid selected from the group consisting of hafnium (Hf), magnesium (Mg), tantalum (Ta), lanthanum (La), silicon (Si), vanadium (V), niobium (Nb), and yttrium (Y),
    wherein the atomic ratio of zinc in the zinc-containing first compound and indium in the indium-containing second compound ranges from about 1:10 to about 10:1.

2. The solution composition for an oxide thin film of claim 1, wherein the metal or metalloid is comprised in the solution composition at about 50 at% or less based on the total number of zinc and indium atoms.

3. The solution composition for an oxide thin film of claim 1, wherein the atomic ratio of the zinc and the indium ranges from about 1:5 to about 5:1.

4. The solution composition for an oxide thin film of claim 1, wherein the atomic ratio of the zinc and the indium ranges from about 1:10 to about 1:1.

5. The solution composition for an oxide thin film of claim 1, wherein the atomic ratio of the zinc and the indium ranges from about 1:5 to about 1:1.

6. The solution composition for an oxide thin film of claim 1, wherein the first compound comprises at least one selected from the group consisting of zinc hydroxide, zinc alkoxide, zinc citrate, zinc acetate, zinc carbonate, zinc (meth)acrylate, zinc nitrate, zinc acetylacetonate, zinc halide, zinc thiocarbamate, zinc sulfonate, zinc undecylate, zinc borate, and hydrates thereof, and
    the second compound comprises at least one selected from the group consisting of indium hydroxide, indium alkoxide, indium citrate, indium acetate, indium carbonate, indium (meth)acrylate, indium nitrate, indium acetylacetonate, indium halide, indium thiocarbamate, indium sulfonate, indium undecylate, indium borate, and hydrates thereof.

7. The solution composition for an oxide thin film of claim 6,
    wherein the first compound comprises zinc acetate hydrate, and
    the second compound comprises indium acetyl acetonate.

8. The solution composition for an oxide thin film of claim 1, further comprises at least one selected from the group consisting of an alcohol amine compound, an alkyl ammonium hydroxy compound, an alkyl amine compound, a ketone compound, an acid compound, a base compound, and deionized water.

9. A method of forming a thin film, comprising:
    preparing a solution composition comprising a zinc-containing first compound, an indium-containing second compound, and a third compound comprising at least one metal or metalloid selected from the group consisting of hafnium (Hf), magnesium (Mg), tantalum (Ta), lanthanum (La), silicon (Si), germanium (Ge), vanadium (V), niobium (Nb), and yttrium (Y);
    applying the solution composition to a substrate; and heat-treating the solution composition applied to the substrate to provide an oxide thin film,
wherein the atomic ratio of zinc in the zinc-containing first compound and indium in the indium-containing second compound ranges from about 1:10 to about 10:1.

10. The method of forming a thin film of claim 9, wherein the first compound comprises at least one selected from the group consisting of zinc hydroxide, zinc alkoxide, zinc citrate, zinc acetate, zinc carbonate, zinc (meth)acrylate, zinc nitrate, zinc acetylacetonate, zinc halide, zinc thiocarbamate, zinc sulfonate, zinc undecylate, zinc borate, and hydrates thereof, and
the second compound comprises at least one selected from the group consisting of indium hydroxide, indium alkoxide, indium citrate, indium acetate, indium carbonate, indium (meth)acrylate, indium nitrate, indium acetylacetonate, indium halide, indium thiocarbamate, indium sulfonate, indium undecylate, indium borate, and hydrates thereof.

11. A method of manufacturing a thin film transistor comprising:
providing a first electrode;
applying a solution composition including a zinc-containing first compound, an indium-containing second compound, and a third compound including at least one metal or metalloid selected from hafnium (Hf), magnesium (Mg), tantalum (Ta), lanthanum (La), silicon (Si), germanium (Ge), vanadium (V), niobium (Nb), or yttrium (Y), at a position overlapping the first electrode;
heat-treating the solution composition to provide an oxide semiconductor thin film;
providing a second electrode that is electrically connected with the oxide semiconductor thin film; and
annealing the oxide semiconductor thin film after providing the first electrode, the oxide semiconductor thin film, and the second electrode,
wherein the atomic ratio of zinc in the zinc-containing first compound and indium in the indium-containing second compound ranges from about 1:10 to about 10:1.

12. The method of manufacturing a thin film transistor of claim 11, wherein the metal or metalloid is included in an amount of 50 at% or less based on the total numbers of zinc and indium atoms of the solution composition.

13. The method of manufacturing a thin film transistor of claim 11, wherein the solution composition comprises the zinc and the indium at an atomic ratio ranging from about 1:5 to about 5:1.

14. The method of manufacturing a thin film transistor of claim 11, wherein the solution composition comprises the zinc and the indium at an atomic ratio ranging from about 1:10 to about 1:1.

15. The method of manufacturing a thin film transistor of claim 11, wherein the solution composition comprises the zinc and the indium at an atomic ratio ranging from about 1:5 to about 1:1.

16. The method of manufacturing a thin film transistor of claim 11, annealing of the oxide semiconductor thin film is performed at about 200 to about 400° C.

17. The method of manufacturing a thin film transistor of claim 11, wherein the annealed oxide semiconductor thin film has resistivity of about $10^{-3}$ Ωcm to about $10^{10}$ Ωcm.

* * * * *